United States Patent [19]

Lenz

[11] Patent Number: 4,539,529
[45] Date of Patent: Sep. 3, 1985

[54] SEMICONDUCTOR AMPLIFIER CIRCUIT

[75] Inventor: Michael Lenz, Munich, Fed. Rep. of Germany

[73] Assignee: Siemens Aktiengesellschaft, Berlin and Muenchen, Fed. Rep. of Germany

[21] Appl. No.: 532,722

[22] Filed: Sep. 15, 1983

[30] Foreign Application Priority Data

Sep. 16, 1982 [DE] Fed. Rep. of Germany ....... 3234400

[51] Int. Cl.³ .......................... H03F 3/68; H03F 3/45
[52] U.S. Cl. .................................. 330/295; 330/261; 330/84
[58] Field of Search ................. 330/252, 261, 84, 295, 330/297, 273

[56] References Cited

U.S. PATENT DOCUMENTS 4,254,380  3/1981  Guillien ............................. 330/273

Primary Examiner—James B. Mullins
Assistant Examiner—G. Wan
Attorney, Agent, or Firm—Herbert L. Lerner; Laurence A. Greenberg

[57] ABSTRACT

A semiconductor amplifier circuit includes first and second operational amplifiers, and first and second voltage dividers connected between the outputs of the first and second operational amplifiers, respectively, and a reference potential source. First and second resistors are connected between the divider point of the first and second voltage dividers, respectively, and the inverting input of the first and second operational amplifiers, respectively, forming real negative feedbacks. A first signal input terminal of the amplifier circuit is connected to the non-inverting input of the first and second operational amplifiers, respectively. A third common voltage divider is connected between the reference potential source and a supply potential source. A common intermediate resistor is connected to the divider point of the common voltage divider, and first and second supply resistors are connected in series with the intermediate resistor. The first and second supply resistors are connected between the intermediate resistor and the non-inverting input of the first and second operational amplifiers, respectively. The first resistor has a resistance substantially equal to the sum of the resistance of the first supply resistor and twice the resistance of the intermediate resistor. The second resistor has a resistance substantially equal to the sum of the resistance of the second supply resistor and twice the resistance of the intermediate resistor.

7 Claims, 5 Drawing Figures 4,539,529

1

SEMICONDUCTOR AMPLIFIER CIRCUIT

BACKGROUND OF THE INVENTION

1. Field of the Invention

The invention relates to a semiconductor amplifier circuit with first and second operational amplifiers, wherein the negative feedback is formed in both operational amplifiers as a real negative feedback, the output of each of these two operational amplifiers is connected through a voltage divider formed of two series-connected resistors to reference potential or ground, a connection exists between the divider point of the respective voltage divider and the inverting signal input of the associated operational amplifier, the connection between the inverting signal input of one operational amplifier and the divider point of the associated voltage divider being provided by an additional resistor, and the non-inverting signal input of both operational amplifiers is connected to a signal input terminal of the amplifier circuit and is furthermore impressed by the supply potential through a supply resistor for each amplifier.

2. Description of the Prior Art

In order to construct such a stereo bridge amplifier with real negative feedback, a number of external resistors and additional structural elements are generally needed. However, since as a rule an offset alignment will also be required, an integrated construction of the combustion of the two operational amplifiers is not feasible in practice. It is accordingly an object of the invention to provide a semiconductor amplifier circuit which overcomes the hereinafore-mentioned disadvantages of the heretofore-known device of this general type, and in which the entire negative feedback of the two operational amplifiers can be monolithically combined with the two operational amplifiers.

SUMMARY OF THE INVENTION

With the foregoing and other objects in view there is provided in accordance with the invention, a semiconductor amplifier circuit, comprising first and second operational amplifiers each having an inverting input, a non-inverting input and an output, a reference potential source, a supply potential source, a first voltage divider formed of two series-connected resistors connected between the output of the first operational amplifier and the reference potential source, a second voltage divider formed of two series-connected resistors connected between the output of the second operational amplifier and the reference potential source, each of the voltage dividers having a divider point between the resistors thereof, a first resistor connected between the divider point of the first voltage divider and the inverting input of the first operational amplifier forming a real negative feedback, a second resistor connected between the divider point of the second voltage divider and the inverting input of the second operational amplifier forming a real negative feedback, a first signal input terminal of the amplifier circuit connected to the non-inverting input of said first operational amplifier, a second signal input terminal of the amplifier circuit connected to the non-inverting input of the second operational amplifier, a third common voltage divider connected between said reference potential source and the supply potential source, the common voltage divider including two resistors defining a divider point therebetween, a common intermediate resistor connected to the divider point of the common voltage divider, and first and second supply resistors connected in series with the intermediate resistor, the first supply resistor being connected between the intermediate resistor and the non-inverting input of the first operational amplifier, the second supply resistor being connected between the intermediate resistor and the non-inverting input of the second operational amplifier, the first resistor having a resistance substantially equal to the sum of the resistance of the first supply resistor and twice the resistance of the intermediate resistor, and said second resistor having a resistance substantially equal to the sum of the resistance of the second supply resistor and twice the resistance of the intermediate resistor.

In accordance with another feature of the invention, the first and second operational amplifiers are alike in construction and rating, the resistors of the first and second voltage dividers are equal, the first and second resistors are equal, and the supply resistors are equal.

In accordance with a further feature of the invention, there is provided another input signal terminal and another resistor connected between the other input signal terminal and the inverting input of one of the operational amplifiers.

In accordance with an additional feature of the invention the other resistor is connected to said inverting input of said first operational amplifier and has a resistance value substantially equal to the first resistor.

In accordance with an added feature of the invention the first and second operational amplifiers, said resistors of the first, second and third common voltage dividers the first and second resistors, the first and second supply resistors, and said intermediate resistor are monolithically combined in a single chip.

Other features which are considered as characteristic for the invention are set forth in the appended claims.

Although the invention is illustrated and described herein as embodied in a semiconductor amplifier circuit, it is nevertheless not intended to be limited to the details shown, since various modifications and structural changes may be made therein without departing from the spirit of the invention and within the scope and range of equivalents of the claims.

BRIEF DESCRIPTION OF THE DRAWING

The construction and method of operation of the invention, however, together with additional objects and advantages thereof will be best understood from the following description of specific embodiments when read in connection with the accompanying drawings, in which.

DESCRIPTION OF THE PREFERRED EMBODIMENTS

Figure 1:
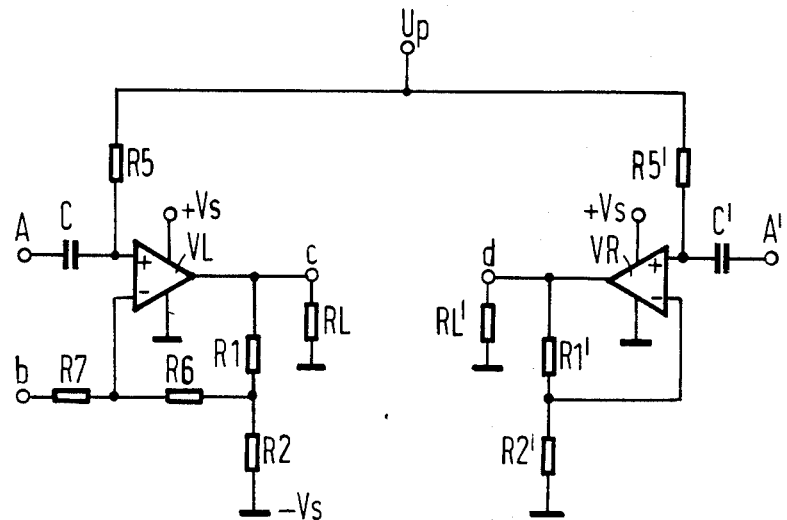
FIG. 1 is a schematic circuit diagram of a conventional semiconductor amplifier circuit.

Referring now to the figures of the drawing in detail and first particularly to FIG. 1 thereof, there is seen a conventional semiconductor amplifier circuit which contains two identical operational amplifiers VL and VR, the non-inverting inputs of which are designated, as usual, by the "+" sign and the inverting inputs by the "−" sign. An output c of one operational amplifier VL is coupled with the inverting input of the operational amplifier VL trough the series connection of two resistors R1 and R6. The divider point between the two resistors R1 and R6 is additionally connected to a reference potential −Vs through a resistor R2, which forms a voltage divider together with the resistor R1 as described above. A negative feedback network of this configuration permits the inverting operation of the amplifier VL which is indispensible for bridge amplifiers. For this purpose the inverting signal input of the operational amplifier VL is controlled through a terminal b and a resistor R7.

In an analogous manner, in the other operational amplifier VR a signal output d is also coupled with the reference potential −Vs through the series connection of two resistors R1' and R2'. Negative feedback is obtained in this case by a direct connection between the divider point between the two resistors R1' and R2' and the inverting signal input of the operational amplifier VR. The feedback is therefore simpler in the case of the operational amplifier VR than in the case of the operational amplifier VL.

The non-inverting signal inputs of the operational amplifiers VL and VR are each connected to a respective signal input A, A', such as through a capacitor C, C', respectively. In addition, the two inputs A and A' are each connected through a respective supply resistor R5, R5' to a common terminal for the purpose of impression with a derived supply potential $U_p$. The signal output c of the operational amplifier VL acts on a load element RL, and the signal output d of the operational amplifier VR acts on a load element RL. The two load elements may be different, such as when the amplifier circuit is operated as a stereo amplifier. Alternatively, they may be a single load element, such as a loudspeaker. Each of the two amplifier outputs c and d then act on a terminal of the common load element. In this case the amplifier circuit is operated as a bridge circuit.

Figure 2:
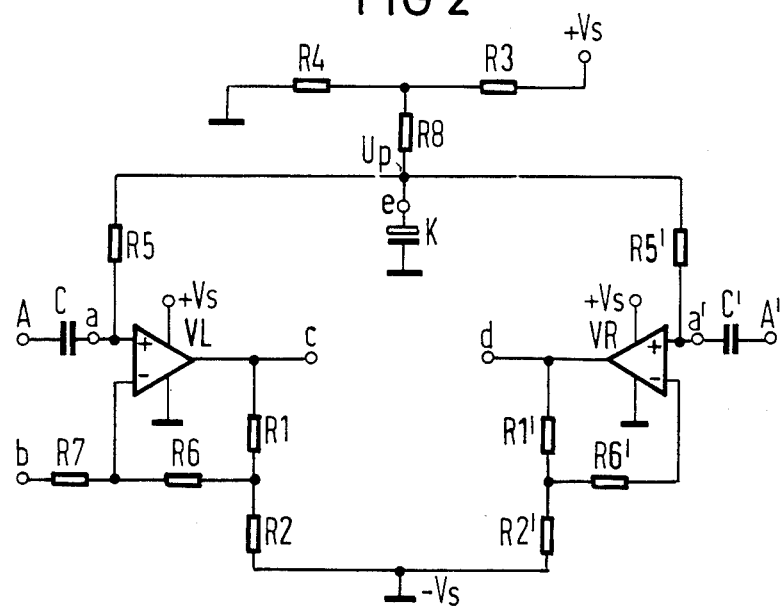
FIG. 2 is a circuit diagram of a semiconductor amplifier circuit according to the invention.

The structure of a semiconductor amplifier circuit according to the invention illustrated in FIG. 2, shows that the non-inverting signal inputs of the two operational amplifiers VL and VR are each connected through a respective supply resistor R5, R5' to a common node carrying the potential $U_p$. On the one hand, the node carrying the potential $U_p$ is connected through an intermediate resistor R8 to the divider point of a voltage divider R4, R3. One end terminal of the voltage divider is supplied by the reference potential −Vs while the other end terminal thereof is supplied by the supply potential +Vs. On the other hand, the node with the potential $U_p$ is connected through a capacitor K to the reference potential −Vs. Additionally, inverting input of one of the two operational amplifiers, the amplifier VL in the illustrated embodiment, is connected through a resistor R7 to a signal input terminal b. The division ratios in the two voltage dividers lying between the signal outputs of the two operational amplifiers VL and VR and the reference potential −Vs may be the same, i.e. R1:R2=R1':R2'. In this case it is especially advisable in the interest of identical amplifier input of the amplifier VL and the signal input b equal to the negative feedback resistor R6.

In view of the circuit according to the invention, illustrated in FIG. 2, the following can be noted: The resistor R1, R2 in one operational amplifier VL and the resistors R1', R2' in the other operational amplifier, form the negative feedback dividers, as can be seen. The polarization voltage $U_p$ at the node between the two supply resistors R5 and R5' is produced by the voltage divider R3, R4 and the intermediate resistor R8. Generally, the two operational amplifiers VR and VL are identical as has been mentioned before, both in construction and in rating. In any event it is advantageous to provide as low an offset voltage of the two operational amplifiers VL and VR as possible. Furthermore, the synchronism range of the two operational amplifiers must extend to the reference potential, that is to −Vs.

If the voltage $U_i = 0$ is present at the signal input A or at the signal input A', (referred to the reference potential −Vs) should therefore satisfy the relation Ua=0 at the output of each of the two operational amplifiers VL and VR because of the extremely low offset voltage. Furthemore, in practice provision will also be made to ensure that with identical operational amplifiers VL and VR the two voltage dividers R1, R2 and R1', R2' are also the same, as indicated above.

With the amplification of the system, i.e. of the respective operational amplifier including its negative feedback, which is determined by the equation $$V_u = 1 + R1/R2$$

that applies for a no-load amplification of the two operational amplifiers, which is large relative to $V_u$, the following equation is obtained for the potential $U_p$ at the node between the two supply resistors R5 and R5'

$$U_p = V_s \times R2/(R1+R2).$$

It R1=R3 is selected, then for the resistors R2 and R4 the values $$R2 = R1/(V_u - 1)$$

and $$R4 = R1 \times R2/(2R1 + R2)$$

are determined, with $$V_u = 1 + R1/R2.$$

The supply resistors R5 and R5' represent the a-c voltage input resistance of the circuit, with respect to the terminals A, A'. The voltage drop at the supply resistor R5, R5' and at the intermediate resistor R8 is compensated with the resistors R6 and R6', respectively. Since the input currents of the two operational amplifiers are identical, we have $R6 = R5 + 2R8$ and $R6' = R5' + 2R8$, respectively.

The capacitor K connects the node between the two supply resistors R5 and R5' with the reference potential −Vs. The function of the capacitor K is to filter the polarization voltage $U_p$ which results due to the connection of the node shown in FIG. 2. In addition, the capacitor essentially determines the transient behavior.

In a monolithic construction of the amplifier circuit according to the invention, the two amplifiers VL and VR as well as all of the resistors shown in FIG. 2 are combined on a common chip. Only the capacitors C, C' and K are external. The integration only becomes possible due to the rating proposed for the negative feedback resistors R6 and R6' according to the invention. However, in this connection it must be noted further that above all the object of the stated condition for the rating of the resistors R6 and R6' is to suppress the offset of the respective amplifiers VL, VR. On the other hand, however, with increasing resistance the negative feedback resistor R6 or R6' has an adverse effect on the noise properties as well as on the suppression of power line hum. For this reason it is furthermore desirable according to the invention to set the supply resistor R5, R5' at the two operational amplifiers VL and VR (which simultaneously fulfills the function of an input resistor) so low that the effect of the negative feedback resistor R6, R6' on the noise properties and on the suppression of power line hum is no longer perceptible. The resistance of each of the two supply resistors R5 and R5' is therefore adjusted so that it lies in the range of 10–30 kOhm, and is in particular 20 kOhm. Due to the use of low-offset operational amplifiers and at amplifications of about 30 dB, offset line-up or alignment is not necessary, since the offset voltage of the amplifiers with $V_u = 1 + R1/R2$ appears at the output and is therefore also amplified.

Figure 4:
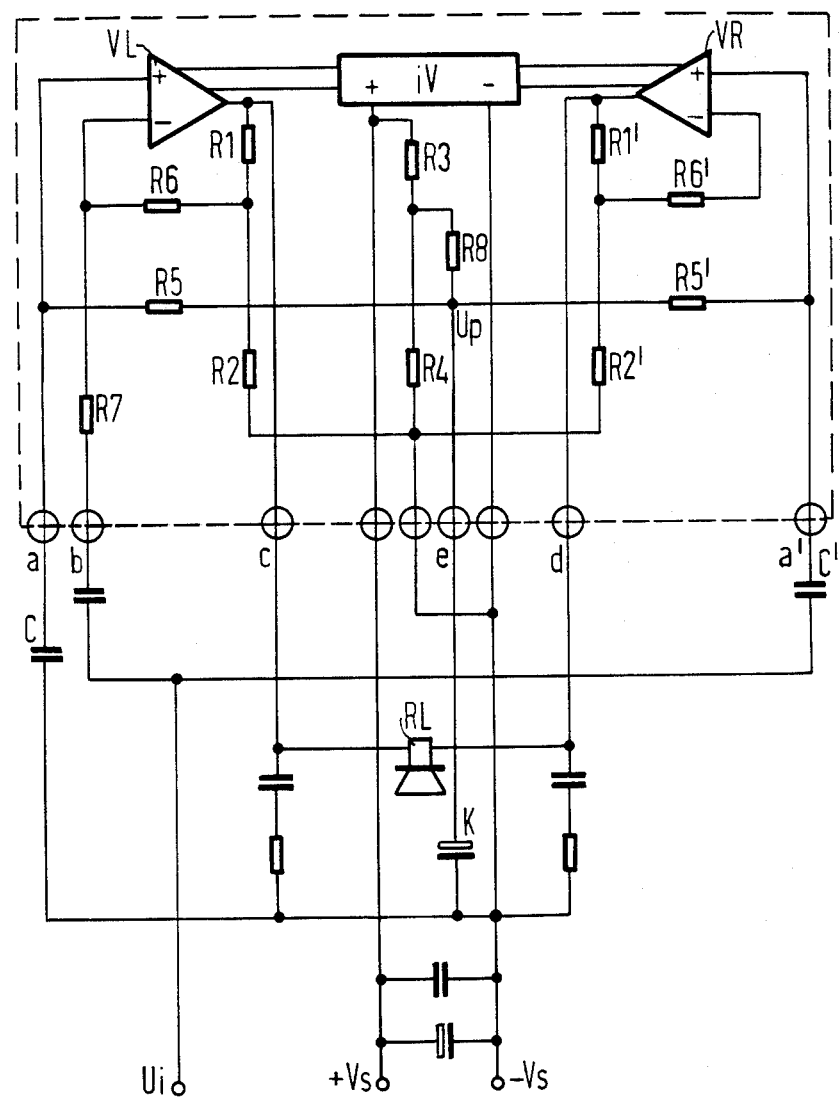
FIGS. 4 and 5 are circuit diagrams showing the main applications for an integrated amplifier circuit according to the invention.

An amplifier circuit according to the invention can be operated on the one hand as a bridge amplifier circuit and on the other hand as a stereo amplifier. The first operation is illustrated in FIG. 4 and the second in FIG. 5, in both cases using the amplifier circuit shown in FIG. 2.

It is is desired to operate the circuit shown in FIG. 2 in a bridge mode, the input A or the input a is connected to the reference potential $-Vs$ (ground) and the inverting input of the amplifier which is coupled through the resistor R7, that is the amplifier VL, is connected to the signal input terminal b which in turn is connected through a capacitor to the input of the amplifier circuit to the energized by the input signal $U_1$. At the same time the non-inverting input of the other operational amplifier, that is the amplifier VR, is also connected to the input $U_1$ of amplifier circuit, through a capacitor. The last-mentioned capacitor is the capacitor c' shown in FIG. 2. The electrometer negative feedback is then superposed on the negative feedback of an inverting amplifier with the resistors R6 and R7, because R6+R7. Upon phase reversal, the same amplification as in the non-inverting mode is then obtained. The following conveniently integrable values are especially favorable for the rating of the resistors provided in FIG. 2:

$R1 = R1' = R3 = 15.3$ kOhm; $R2 = R2' = 500$ Ohm;

$R6 = R6' = R7 = 22$ kOhm; $R5 = R5' = 20$ kOhm $R4 = 246$ Ohm and $R8 = 1$ kOhm.

The degree of amplification of the two amplifiers VL and VR is set to the value $(1+R1/R2) = 30$ dB. Thus no difficulties arise in monolithically combining the resistors just described with the two amplifiers VL and VR if the usual rules of integration are taken into consideration such as preventing undesired thermal and electrical coupling.

Figure 5:
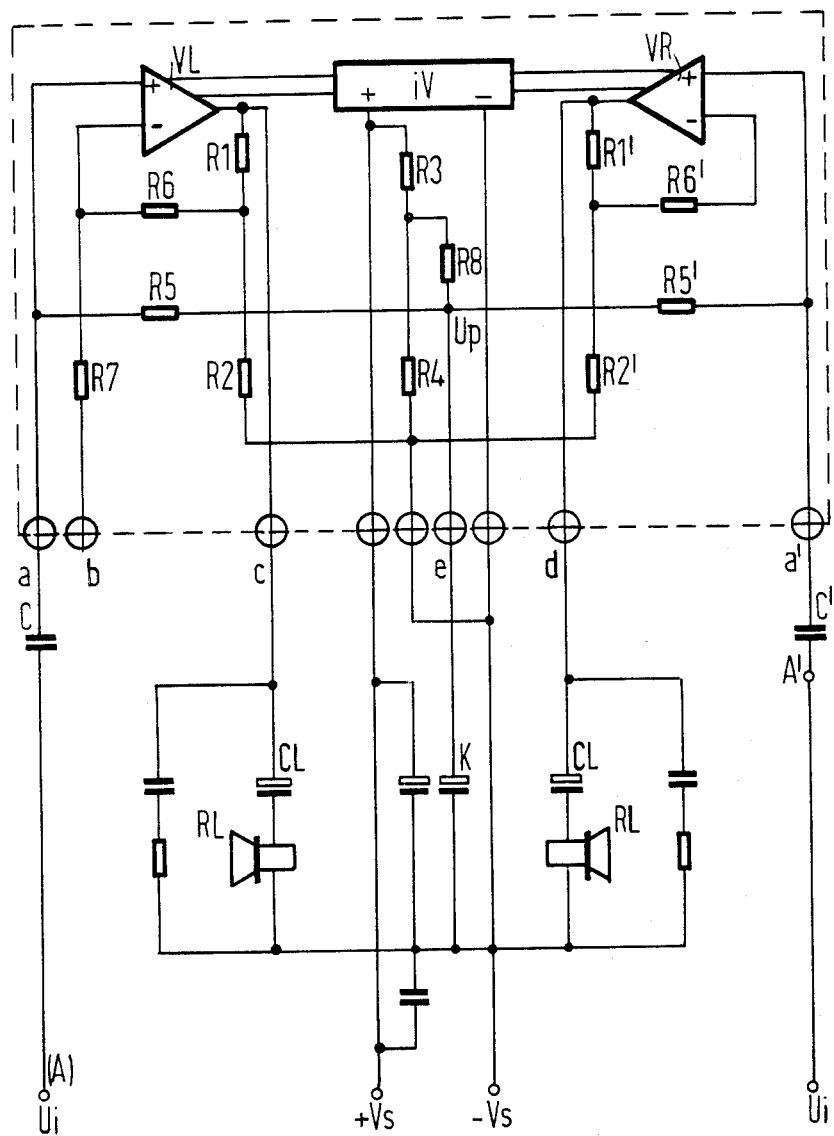

On the other hand, the Capacitor K used for filtering is external and has a capacitance of 100 µF. As shown in FIGS. 4 and 5, the capacitor K is used as a bridge circuit and for operation as a stereo amplifier. The filter effect of the capacitor K is substantially increased by the resistor R8 (that is, the intermediate resistor).

Figure 3:
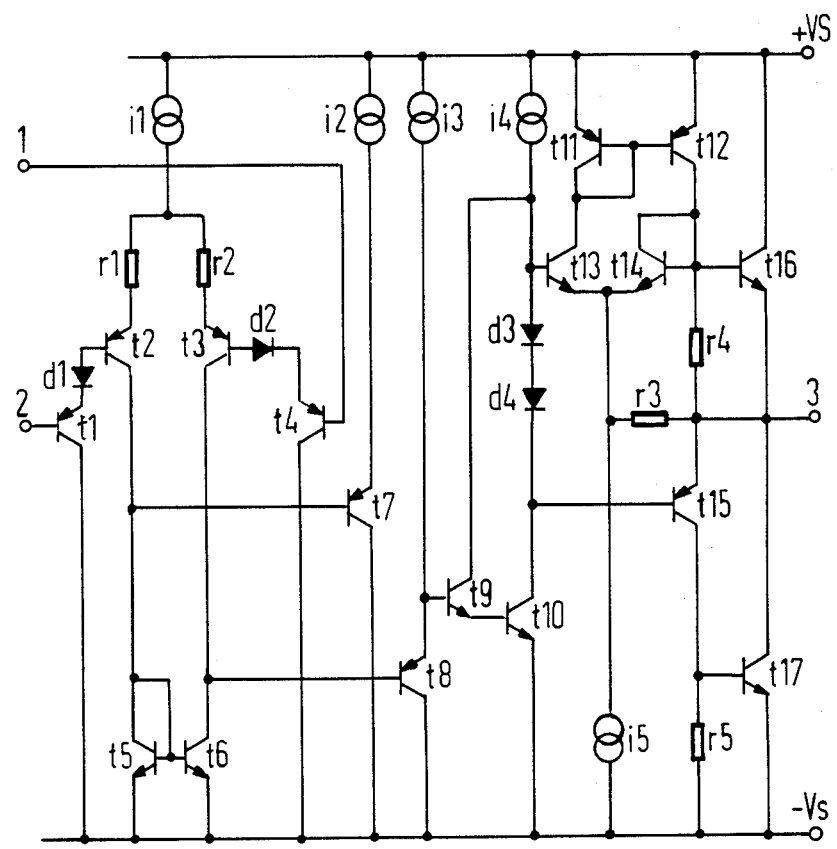
FIG. 3 is a circuit diagram of two operational amplifiers suitable for use in the amplifier according to the invention.

A circuit for the two operational amplifiers VL and VR which can be constructed monolithically is illustrated in FIG. 3. The circuit uses pnp and npn transistors as well as diodes and resistors.

The non-inverting input 1 of such an amplifier controls the base of a pnp transistor t4, the collector of which is connected to the reference potential $-Vs$ and the emitter of which is connected to the cathode of a diode d2, and through this diode to the base of an additional pnp transistor t3. An inverting input 2 is shown, which has circuitry that corresponds to that of the non-inverting input 1. Accordingly, the input 2 forms the base connection of a third pnp transistor ti, the collector of which is also connected to the reference potential $-Vs$ and the emitter of which is connected to the cathode of a diode d1, and through this diode d1 to the base of a fourth pnp transistor t2. The emitter of the second pnp transistor t3 is coupled through the series connection of two equal resistors r2, r1, with the emitter of the fourth pnp transistor t2. Furthermore, the junction between the two resistors r1 and r2 is connected through a constant current source i1 to the positive terminal $+Vs$ of the supply voltage source, the negative terminal of which furnishes the reference potential $-Vs$.

The collection of the second pnp transistor 43 is coupled with the collector of a first npn transistor t6, the emitter of which is connected to the reference potential $-Vs$ and the base of which is connected both to the collector of the fourth pnp transistor t2 and to the base and collector of a second npn transistor t5. The emitter of this npn transistor t5 is connected directly to the reference potential $-Vs$. The collectors of the pnp transistor t1 and of the pnp transistor t4 are also connected to the reference potential $-Vs$, as has been mentioned above.

The collector of the second pnp transistor t3 as well as the collector of the fourth pnp transistor t2 each control the base of a respective additional pnp transistor t8, t7. The emitter of the pnp transistor t7 (controlled by the fourth pnp transistor t2) is connected through a current source 12 to the supply potential $+Vs$ and the collector of the transistor t7 is connected to the reference potential $-Vs$. The emitter of the pnp transistor t8(controlled by the second pnp transistor t3) is connected through an additional current source 13 to the supply potential $+Vs$ and the collector of the transistor 8 is connected to the reference potential $-Vs$ as well. In contrast to transistor t7, however, the emitter of the pnp transistor t8 is connected to the base of a third npn transistor t9, the emitter-collector path of which is bridged or shunted by the series connection of two diodes d3, d4 equal of polarity and the base-collector diode of a fourth npn transistor t10. To this enc, the collector of the third npn transistor t9 is connected, on one hand, through a fourth constant current source i4 to the supply potential $+Vs$ and on the other hand to the anode of the diode d3. The cathode of the diode d3 is connected to the anode of the diode d4, and the cathode of the diode d4 is connected to the collector of the fourth npn transistor t10. The base of the fourth npn transistor t10 is connected to the emitter of the third npn transistor t9. The emitter of the fourth npn transistor t10 is connected to the reference potential $-Vs$, while the collector of the transistor t10 is additional directly connected to the base of a seventh pnp transistor t15. It should furthermore be mentioned that the collector of the third npn transistor t9 is connected to the base of a fifth npn transistor t13.

The last-mentioned npn transistor t13 together with a sixth npn transistor t14 forms an emitter-coupled differential amplifier, both emitters of which are connected through a fifth current source 15 to the reference potential −Vs. The collector of the fifth npn transistor t13 is connected to the base and to the collector of an eighth pnp transistor t11, the emitter of which is connected to the supply potential +Vs. The base and collector of the transistor t11 are furthermore connected to the base of a ninth pnp transistor t12. The emitter of this pnp transistor t12 is directly connected to the supply potential +Vs and the collector of the transistor t12 is directly connected to the collector and base of the sixth npn transistor t14.

Two additional npn transistor t16 and t17 are interconnected in series with respect to their emitter-collector paths. The collector of the seventh npn transistor t16 is connected to the supply potential +Vs and its emitter is connected to the signal output 3 of the single-ended amplifier. On the other hand, the emitter of the eighth npn transistor t17 is directly connected with the terminal carrying the reference potential −Vs, while its collector is connected to the signal output 3 of the amplifier. The base of the eighth npn transistor t17 is connected through a resistor r5 with the reference potential −Vs and in addition it is connected with the collector of the seventh pnp transistor t15. On the contrary, the base of the seventh npn transistor t16, is connected through a resistor r4 both with the signal output 3 of the single-ended amplifier and with the emitter of the seventh pnp transistor t15. In addition, the base of the seventh npn transistor t16 is connected to the collector and to the base of the sixth npn transistor t14. It should additionally be mentioned that the signal output 3 of the single-ended amplifier is coupled via a resistor r3 with the emitters of the fifth and sixth npn transistors t13 and t14, respectively. The pnp transistor t7 has the function of compensating the base current of the pnp transistor t8.

The preferred embodiment illustrated in FIG. 3 for the two operational amplifiers VL and VR offers the following essential advantages:
(a) The synchronism range of the input terminals 1 and 2 up to −Vs is assured by the diodes d1 and d2.
(b) The offset minimalization is then achieved by the following measures:
  (1) The base currents of the transistors t5 and t6 are compensated for the typical current amplification through the emitter area ratio of the transistors t5 and t6;
  (2) The base current of the transistor t8 is compensated, as has been indicated before, by the base current of a similar pnp transistor t7 which carries the same collector current as the transistor t8. Therefore, I2=I3 must apply.

The advantages mentioned under (a) and (b) also come into play especially when using operational amplifiers which are constructed according to FIG. 3, in the circuit of the invention according to FIG. 2.

FIG. 4 shows the application of an integrated circuit constructed according to FIG. 2 as a bridge amplifier. The load element RL to be operated, e.g. a loudspeaker, has one signal input connected to the terminal c and another signal input connected to the terminal d of a circuit according to FIG. 2. Furthermore, terminal and terminal a′ of this circuit are each connected through a capacitor having a capacitance of 100 μF at the input of the entire amplifier circuit impressed by the signal Ui to be amplified. (The capacitor connected at terminal or pin a′ is the capacitor C′ in FIG. 2.) The pole of the supply voltage source which furnishes the supply potential +Vs is connected through a capacitor of 1000 μF with the pole furnishing the reference potential −Vs. Furthermore, the pole of the supply voltage source which furnishes the supply potential +Vs is connected to the corresponding supply terminal (not specifically identified) of the integrated amplifier circuit, while the pole of the supply voltage source which furnishes the reference −Vs is connected to two supply terminals of the integrated circuit. Additionally, each of the two signal inputs of the load element RL is connected through a capacitor of 100 nF to a 1 ohm resistor, which are in turn connected to the terminal of the supply voltage source furnishing the reference potential −Vs. This pole of the supply voltage source is also connected with the filter capacitor K which was already introduced in connection with FIG. 2 and which has a capacitance of 100 μF. The other terminal of the capacitor K is connected through a terminal or pin e in the interior of the IC with the node carrying the potential $U_p$.

A circuit element iV is provided in the interior of the integrated amplifier circuit which transmits the supply voltage to the two operational amplifiers VL and VR. In the simplest case this circuit element iV is reduced to the two internal conducting connections leading to the two OPs. It should be noted at this point that one of the two pins of the IC carrying the reference potential −Vs merely serves to supply the non-inverting signal inputs of the two operational amplifiers LV and VR and accordingly is connected in the interior of the IC to the resistor R4 of the voltage divider R3, R4, and also serves to supply the reference potential −Vs for the two negative feedback voltage dividers R1, R2 and R1′ and R2′, respectively. The second terminal pin carrying the reference potential −Vs furnishes the reference potential −Vs needed, for example, in the circuit according to FIG. 3.

The circuit represented in FIG. 5 shows the structure of the external wiring of the integrated amplifier circuit according to the invention in the case of its use as a stereo amplifier.

In this case, the input signal Ui to be processes is connected through the capacitor C at the signal input pin a and at the signal input pin a′, while the signal input b is not impressed. The terminal of the supply source furnishing the supply potential +Vs is connected to the same supply pin as in the case of FIG. 4. In addition, the terminal carrying +Vs is connected through a capacitor of 100 μF with one terminal of both the filter capacitor K as well as the two load elements RL, which are identical and, for example, each represent a loudspeaker. A respective capacitor CL having a capacitance of, for example, about 1000 μF, is connected between each of the load elements and one of the output pins c, d of the IC leading to one of the outputs of each of the two operational amplifiers VL and VR. In addition, each of the two load elements RL including the associated capacitor CL is bridged or shunted by a series connection of a capacitor of 100 μF and a resistor of 1 Ohm, the capacitor being connected to the capacitor CL and the resistor being connected to the load element RL. There is also provided an additional capacitor with a capacitance of 1000 μF which, together with the previously mentioned capacitor, connects the input for the supply potential +Vs with one signal terminal of each of the two load elements RL and therefore is connected in parallel with the first-mentioned capacitor.

Details concerning operation for the use of the amplifier circuit of the invention illustrated in FIGS. 4 and 5, respectively, have been given above.

The foregoing is a description corresponding, in substance, to German application No. P 32 34 400.7 dated Sept. 16, 1982, international priority of which is being claimed for the instant application. Any material discrepancies between the foregoing specification and the specification of the aforementioned corresponding German application are to be resolved in favor of the latter.

I claim:

1. Semiconductor amplifier circuit, comprising first and second operational amplifiers each having an inverting input, a non-inverting input and an output, a reference potential source, a supply potential source, a first voltage divider formed of two series-connected resistors connected between said output of said first operational amplifier and said reference potential source, a second voltage divider formed of two series-connected resistors connected between said output of said second operational amplifier and said reference potential source, each of said voltage dividers having a divider point between said resistors thereof, a first resistor connected between said divider point of said first voltage divider and said inverting input of said first operational amplifier forming a real negative feedback, a second resistor connected between said divider point of said second voltage divider and said inverting input of said second operational amplifier forming a real negative feedback, a first signal input terminal of the amplifier circuit connected to said non-inverting input of said first operational amplifier, a second signal input terminal of the amplifier circuit connected to said non-inverting input of said second operational amplifier, a third common voltage divider connected between said reference potential source and said supply potential source, said common voltage divider including two resistors defining a divider point therebetween, a common intermediate resistor connected to said divider point of said common voltage divider, and first and second supply resistors connected in series with said intermediate resistor, said first supply resistor being connected between said intermediate resistor and said non-inverting input of said first operational amplifier, said second supply resistor being connected between said intermediate resistor and said non-inverting input of said second operational amplifier, said first resistor having a resistance substantially equal to the sum of the resistance of said first supply resistor and twice the resistance of said intermediate resistor, and said second resistor having a resistance substantially equal to the sum of the resistance of said second supply resistor and twice the resistance of said intermediate resistor.

2. Semiconductor amplifier circuit according to claim 1, wherein said first and second operational amplifiers are alike in construction and rating, said resistors of said first and second voltage dividers are equal, said first and second resistors are equal, and said supply resistors are equal.

3. Semiconductor amplifier circuit according to claim 1, including another input signal terminal and another resistor connected between said other input signal terminal and said inverting input of one of said operational amplifiers.

4. Semiconductor amplifier circuit according to claim 2, including another input signal terminal and another resistor connected between said other input signal terminal and said inverting input of one of said operational amplifiers.

5. Semiconductor amplifier circuit according to claim 3, wherein said other resistor is connected to said inverting input of said first operational amplifier and has a resistance value substantially equal to said first resistor.

6. Semiconductor amplifier circuit according to claim 4, wherein said other resistor is connected to said inverting input of said first operational amplifier and has a resistance value substantially equal to said first resistor.

7. Semiconductor amplifier circuit according to claim 1, wherein said first and second operational amplifiers, said resistors of said first, second and third common voltage dividers, said first and second resistors, said first and second supply resistors, and said intermediate resistor are monolithically combined in a single chip.

* * * * *